US007056130B1

(12) United States Patent
McAlonis et al.

(10) Patent No.: US 7,056,130 B1
(45) Date of Patent: Jun. 6, 2006

(54) SOCKET CONNECTOR WITH INSPECTION DATUM WINDOWS

(75) Inventors: Matthew Richard McAlonis, Elizabethtown, PA (US); Elwood Scott Martin, Manchester, PA (US); Jeffrey Byron McClinton, Harrisburg, PA (US); George Essa Albert, Shiremanstown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/054,477

(22) Filed: Feb. 9, 2005

(51) Int. Cl.
*H01R 12/00* (2006.01)

(52) U.S. Cl. .................... 439/71; 439/526; 439/910
(58) Field of Classification Search ............ 439/70–73, 439/526, 525, 910, 912
See application file for complete search history.

(56) References Cited

U.S. PATENT DOCUMENTS

| 5,437,557 | A | * | 8/1995 | Sagano | 439/72 |
| 6,196,849 | B1 | * | 3/2001 | Goodwin | 439/71 |
| 6,287,137 | B1 | * | 9/2001 | Noda et al. | 439/342 |
| 6,375,476 | B1 | | 4/2002 | Goodwin et al. | |
| 6,699,047 | B1 | * | 3/2004 | McHugh et al. | 439/71 |
| 6,848,936 | B1 | * | 2/2005 | DeFord | 439/526 |
| 2004/0023543 | A1 | | 2/2004 | Murr | |

* cited by examiner

*Primary Examiner*—Gary Paumen

(57) ABSTRACT

A socket connector is provided that includes a housing holding a plurality of electrical contacts. The housing includes a base having a top side and a bottom side. Opposed side walls upwardly extend from the top side of the base. A datum protrusion is formed on each of the side walls. The datum protrusions define a first dimension extending in a first direction and a second dimension extending in a second direction that is perpendicular to the first direction. The first and second dimensions extend from a maximum protrusion on one of the side walls to a maximum protrusion on an opposed side wall. An inspection window is proximate each datum protrusion. The inspection window enables a measurement of the first dimension and the second dimension.

20 Claims, 5 Drawing Sheets

SOCKET CONNECTOR WITH INSPECTION DATUM WINDOWS

BACKGROUND OF THE INVENTION

The invention relates generally to area array socket connectors and particularly to a land grid array (LGA) socket connector.

Competition and market demands have continued the trends toward faster, higher performance electrical systems, particularly with regard to computer systems. Along with the development of surface mount technology in the design of printed circuit boards, higher density electrical circuits, including higher density interconnect components have been developed to meet the increasing demand for higher performance electrical systems.

As is known in the art, surface mountable packaging allows for the connection of the package to pads on the surface of the circuit board rather than by contacts or pins soldered in plated holes extending through the circuit board. As used herein, the term "package" shall refer to a chip carrying module that is to be mounted to a circuit board. Surface mount technology allows for an increased component density on a circuit board, thereby saving space on the circuit board.

Area array socket connectors have evolved, along with surface mount technology, as one high density interconnect methodology. One significant application of this technology, for example, is the land grid array (LGA) socket connector that is used with an LGA package. One major advantage of the LGA package lies in its durability. The LGA package is not easily damaged during the installation or removal process or by handling generally. At least some of the other IC packages, such as a pin grid array (PGA) package, have a standardized layout, or form factor, for contact leads or pins on the package. These contact leads are somewhat fragile and can be damaged if not handled properly. By contrast, with an LGA package, there is nothing protruding from the package that can be bent or otherwise damaged during normal handling.

The LGA package includes an array of contact areas or pads on an underside thereof. The LGA package is typically loaded into an LGA socket which establishes electrical continuity between the LGA package and the circuit board.

Typically, the LGA socket includes an array of contacts and the circuit board includes a pad pattern or contact pad array that both correspond to the contact array on the LGA package. Generally, the LGA socket contacts each include a solder ball pad and a solder ball for mounting to the circuit board and a contact tip for mating to the LGA package.

When loaded into the socket, the LGA package registers on the interior side walls of the socket. To assure proper electrical continuity between the LGA package and the circuit board, the solder balls on the socket contacts must also be registered to the socket side walls. Presently, the solder balls are referenced to a socket side wall, however, there is no way to visually inspect the position of the solder balls relative to the socket side walls.

BRIEF DESCRIPTION OF THE INVENTION

In one aspect, a socket connector is provided. The socket connector includes a housing holding a plurality of electrical contacts. The housing includes a base having a top side and a bottom side. Opposed side walls upwardly extend from the top side of the base. A datum protrusion is formed on each of the side walls. The datum protrusions define a first dimension extending in a first direction and a second dimension extending in a second direction that is perpendicular to the first direction. The first and second dimensions extend from a maximum protrusion on one of the side walls to a maximum protrusion on an opposed side wall. An inspection window is proximate each datum protrusion. The inspection window enables a measurement of the first dimension and the second dimension.

Optionally, the datum protrusions and the inspection windows are located proximate raised corners formed by the side walls of the housing. The first and second dimensions define a geometric center relative to a raised corner formed by the side walls of the housing. The geometric center has coordinates that include a mid point of each of the first and second dimensions. The geometric center is a reference point for locating each of the plurality of contacts relative to a raised corner formed by the side walls of the housing. The datum protrusions also register an integrated circuit (IC) module when the IC module is loaded into the socket.

In another aspect, a socket connector is provided. The socket connector includes a housing holding a plurality of electrical contacts. The housing includes a base having a top side and a bottom side, and opposed side walls upwardly extending from the top side of the base. A datum protrusion is formed on each of the side walls, the datum protrusion including a maximum protrusion on the side wall. An aperture extends through the base proximate each datum protrusion. The aperture is located such that the maximum protrusion on the datum protrusion can be detected from the upper side and the lower side of the base.

DETAILED DESCRIPTION OF THE INVENTION

Figure 1:
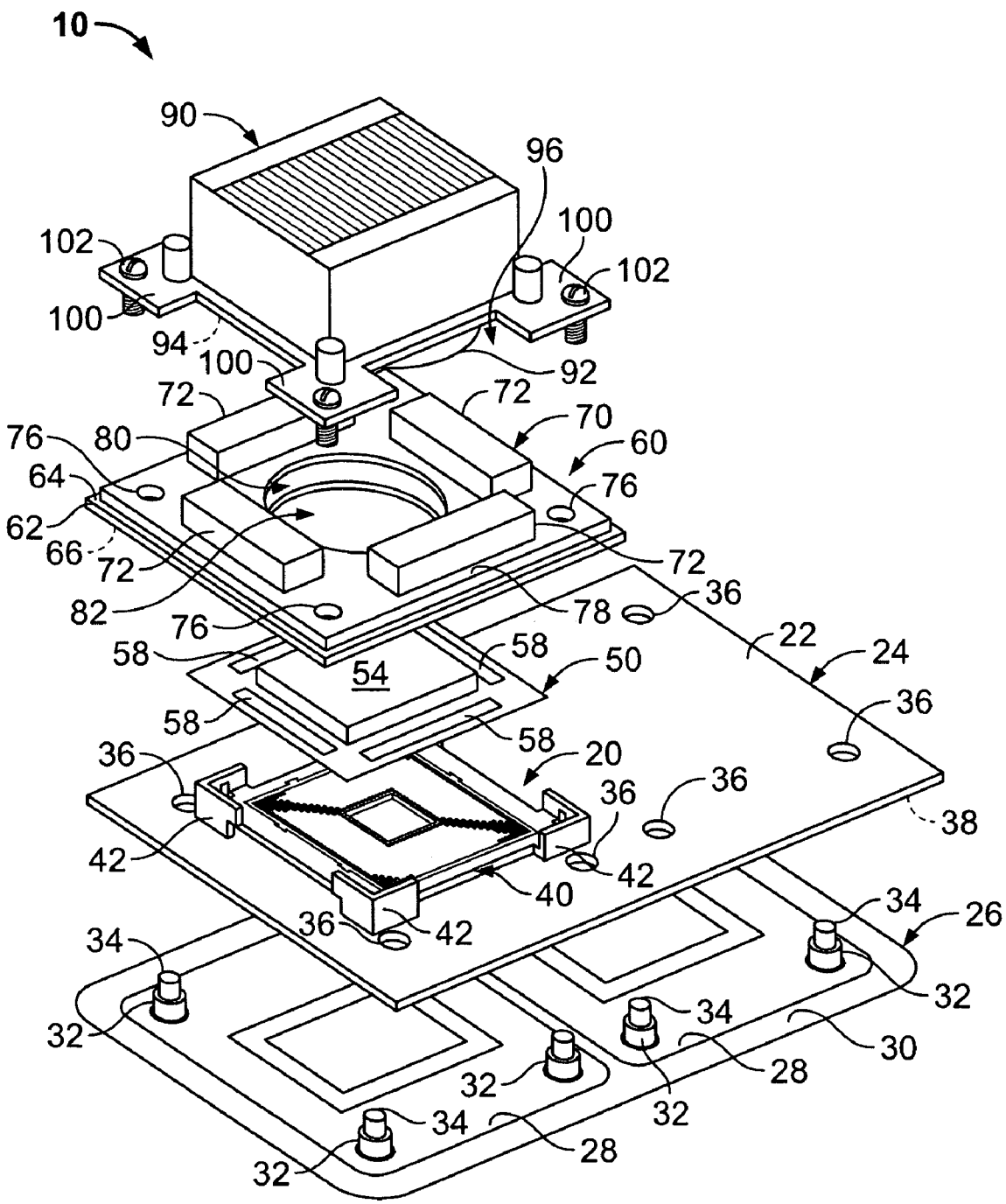
FIG. 1 is a perspective view of an electronic assembly that includes a socket connector formed in accordance with an exemplary embodiment of the present invention.

FIG. 1 is an exploded view of an electronic assembly 10 that includes a socket connector 20 formed in accordance with an exemplary embodiment of the present invention. The socket connector 20 is mounted on an upper surface 22 of a circuit board 24. The circuit board 24 is mounted on a chassis stiffener plate 26 that includes preload assemblies 28 on an upper surface 30 thereof. Mounting posts 32 that include internally threaded extensions 34 extend upwardly from the preload assemblies 28. The mounting posts 32 are received in mounting holes 36 in the circuit board 24 such that a lower surface 38 of the circuit board 24 rests on preload assemblies 28 on the chassis stiffener plate 26.

The socket connector 20 includes a housing 40 having raised corner sections 42 that position and align an integrated circuit (IC) module 50 that is received in the socket connector 20. The IC module 50 includes an electronic package 54 having an array of contact pads on an underside (not shown) that are electrically connected to the circuit board 24 through the contacts 164 (FIG. 2) in the socket connector housing 40 of the socket connector 20. The electronic package 54 can be any power consuming device such as, but not limited to, a central processing unit (CPU), microprocessor, or an application specific integrated circuit (ASIC), or the like. In one embodiment, the socket connector 20 is a land grid array (LGA) socket connector and the electronic package 54 is also in the LGA format. However, in alternative embodiments, other commonly used connector formats such as a ball grid array (BGA) or pin grid array (PGA) can be used. It is to be understood that the following description is for illustrative purposes only and is but one potential application of the inventive concepts herein.

In one embodiment the IC module 50 also includes power interface pads 58 and the electronic assembly 10 includes a power connector assembly 60. The power connector assembly 60 includes a power board 62 that has a top side 64 and a bottom side 66. A power heat sink assembly 70 includes heat sinks 72 and is positioned on the top side 64 of the power board 62 to cool power connectors (not shown) positioned on the bottom side 66 of the power board 62. The power connectors mate with the power interface pads 58. Mounting holes 76 extend through the power board 62 and a base 78 of the power heat sink assembly 70 to receive the threaded extensions 34 on the mounting posts 32 when the electronic assembly 10 is assembled. Access holes 80 and 82 are provided in the power heat sink assembly 70 and the power board 62, respectively, that are open to the electronic package 54.

A package heat sink 90 is provided for cooling the electronic package 54. The package heat sink 90 includes a portion 92 that extends vertically downward from a lower surface 94 to engage the electronic package 54. The package heat sink 90 also includes relief cutouts 96 and mounting pads 100. The relief cutouts 96 provide clearance for the heat sinks 72. The mounting pads 100 include threaded fasteners 102 that are received in the threaded extensions 34 to mount the package heat sink 90 and also hold the assembly 10 together. The fasteners 102 may be screws or bolts, or other known fasteners. The fasteners 102 also provide a compressive operating load or mating load to the electronic package 54 to fully mate the electronic package 54 to the contacts 164 (FIG. 2) in the socket connector 20. In other embodiments, the electronic assembly 10 may include additional components such as a second socket connector 20, IC module 50, and heat sink 90.

Figure 2:
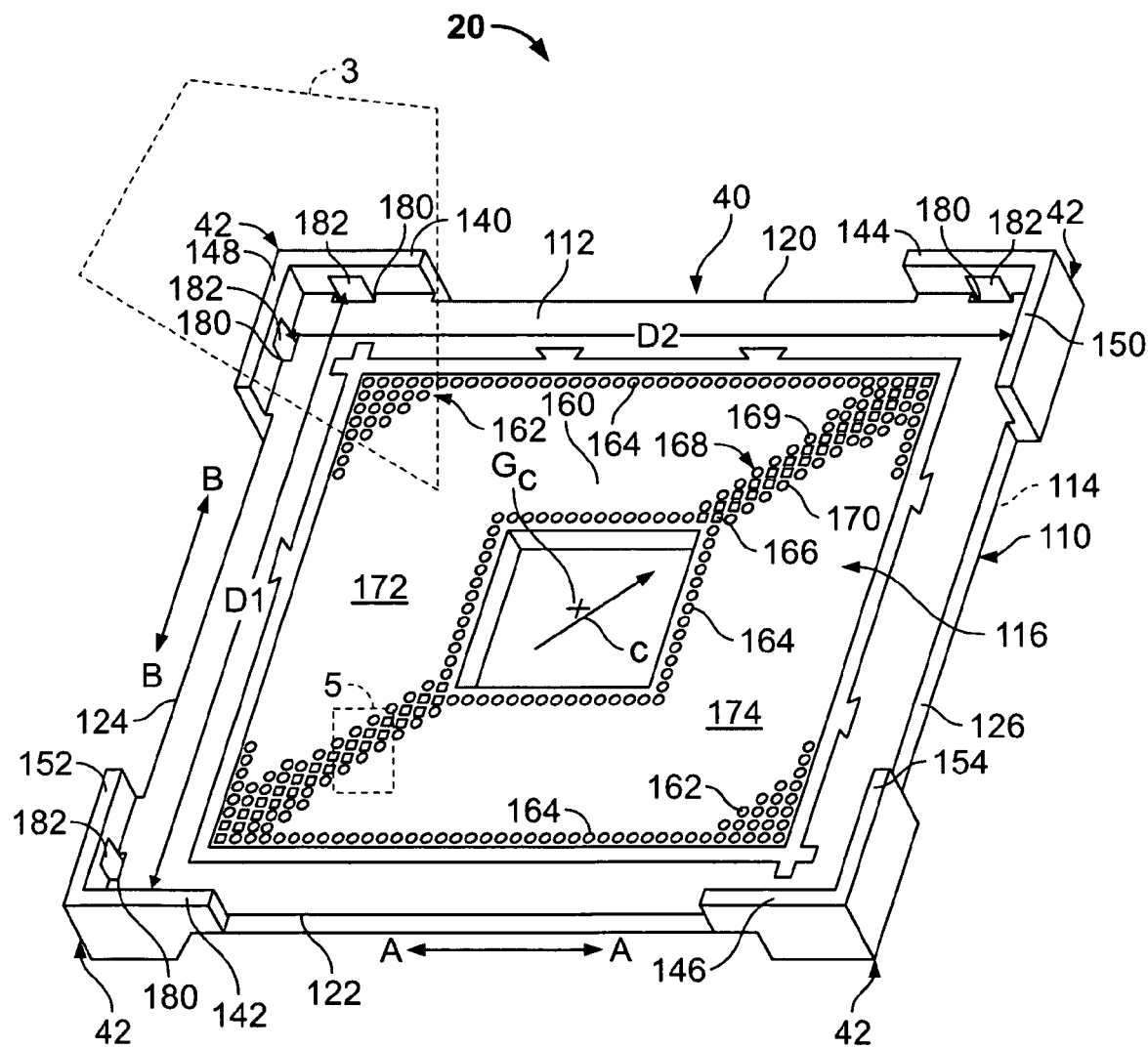
FIG. 2 is an enlarged perspective view of a socket connector shown in FIG. 1.

FIG. 2 is an enlarged perspective view of the socket connector 20. The socket connector 20, in one embodiment, is a Land Grid Array (LGA) socket connector that is surface mounted to the circuit board 24. The socket connector 20 includes a housing 40 that includes a base 110 having a top side 112 and a bottom side 114. The base 110 includes opposite side edges 120 and 122, and 124 and 126. The base 110 is substantially rectangular in shape, although other geometric forms and shapes may be employed in alternative embodiments.

The raised corner sections 42 extend upwardly from the top side 112 of the base 110 to define an interior region 116 of the socket connector housing 40. The raised corner sections 42 are formed by opposed side walls 140 and 142, 144 and 146, 148 and 150, and 152 and 154 that also upwardly extend from the base 110. Side walls 140, 142, 144, 146, 148, 150, 152, and 154 are partial side walls. In an alternative embodiments, side walls 140 and 144 may be joined to form one continuous side wall along the side edge 120, and in a similar manner, continuous side walls could be formed along the side edges 122, 124, and 126.

The base 110 defines a contact field 160 that includes a plurality of contact cavities 162 that hold a plurality of contacts 164. A number of the contact cavities 166 are not loaded with contacts and are arranged along a diagonal 168 that extends through the contact field 160 in the direction of the arrow C. The diagonal 168 has a first side 169 and a second side 170. The diagonal 168 divides the contact field 160 into a first contact array 172 on the first side 169 of the diagonal 168 and a second contact array 174 on the second side 170 of the diagonal 168.

Each of the raised corners 42 includes at least one aperture or inspection window 180 formed at a respective side edge 120, 122, 124, 126 adjacent a respective side wall 140, 142, 144, 146, 148, 150, 152, 154. In an exemplary embodiment, each raised corner 42 includes two inspection windows 180, one at each side edge 120, 122, 124, 126 adjacent a respective side wall 140, 142, 144, 146, 148, 150, 152, 154. Each inspection window 180 extends from the top side 112 of the base 110 through to the bottom side 114 of the base 110. A datum protrusion 182 is formed on each side wall 140, 142, 144, 146, 148, 150, 152, 154 proximate each inspection window 180. Each of the datum protrusions 182 extends toward the interior region 116 of the socket connector housing 40 and is formed to provide a maximum protrusion 192 (FIG. 3) on each side wall 140, 142, 144, 146, 148, 150, 152, 154 into the interior region 116. In this manner, the IC module 50 (FIG. 1) is forced to register and align on the datum protrusions 182 in the interior region of the socket connector housing 40. Opposite pairs of datum protrusions 182 determine datum dimensions that can be used to precisely locate the contacts 164 and the electronic package 54 (FIG. 1) relative to the raised corners 42 of the socket connector housing 40.

In an exemplary embodiment, the side edges 120 and 122 are substantially parallel to one another and define a first direction parallel to the line A—A, and the side edges 124 and 126 are substantially parallel to one another and define a second direction parallel to the line B—B that intersects the first directional line A—A. The protrusions 182 on side walls 140 and 142 determine a first datum dimension $D_1$ that is parallel to the line B—B. The protrusions 182 on the side walls 148 and 150 determine a second datum distance $D_2$ that is parallel to the line A—A and is perpendicular to the first datum dimension $D_1$. The mid or half-way points of the first and second datum dimensions $D_1$ and $D_2$ define a geometric center $G_C$ of the socket connector housing 40 relative to the raised corner 42 defined by the side walls 140 and 148 such that each contact 164 can be located relative to the raised corner 42 between side walls 140 and 148.

Figure 3:
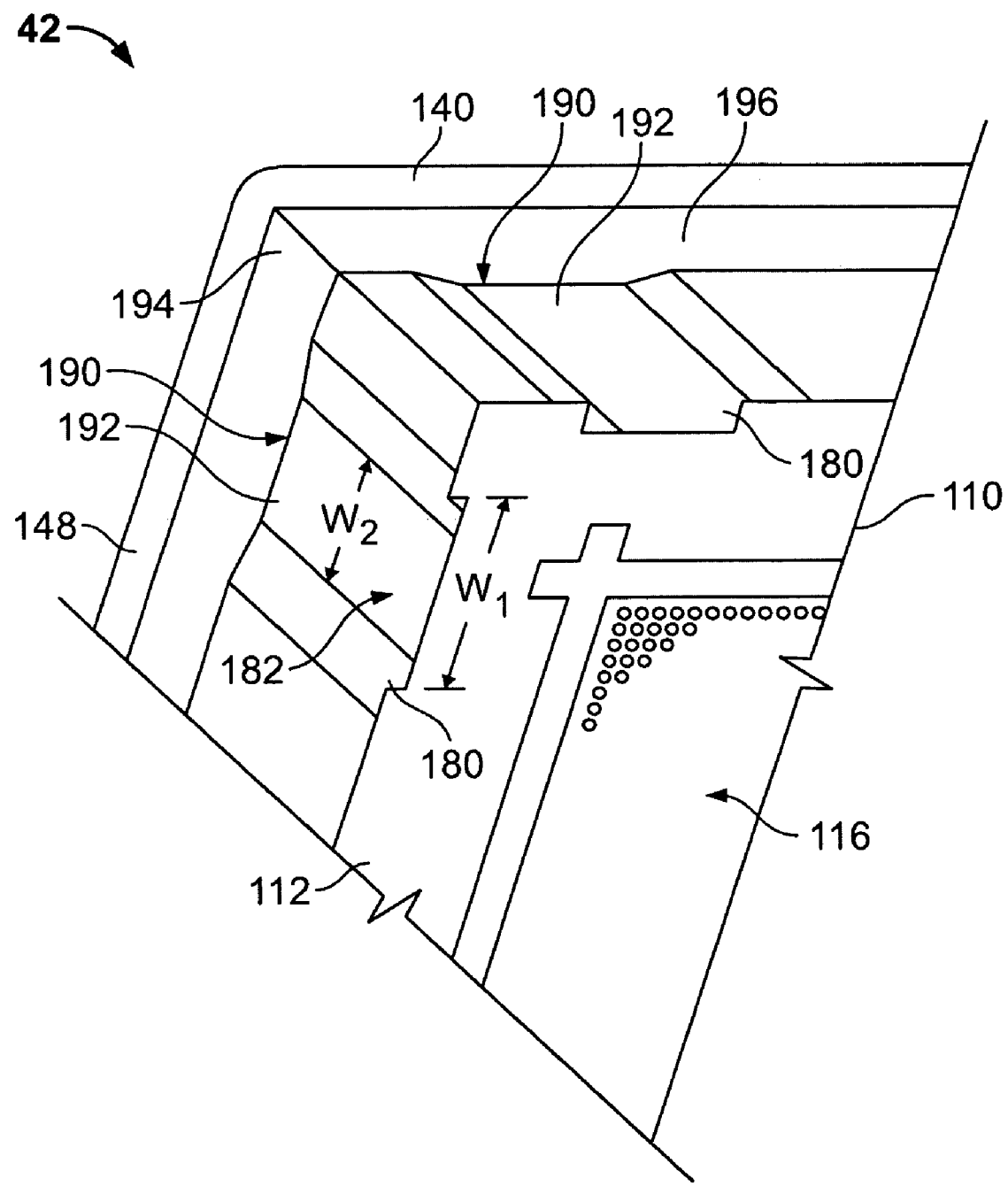
FIG. 3 is an enlarged fragmentary view of a portion of the socket connector shown in FIG. 2, illustrating inspection windows.

FIG. 3 is an enlarged view of the raised corner 42 of the socket connector 20 shown in the phantom section 3 of FIG. 2. Each of the inspection windows 180 has a width $W_1$ Each of the datum protrusions 182 includes a protruding center section 190 that has a width $W_2$ that is less than the width $W_1$ of the inspection windows 180. With current manufacturing techniques, the side walls 140, 148 may not be straight or flat or perpendicular to the top surface 112 of the base 110. As a result, the datum protrusions 182 are formed with the protruding center sections 190 to assure that the maximum protrusion 192 on each of the side walls 140 and 148 are on the datum protrusions 182, and further, the protruding center sections 190 are positioned to be within the width $W_1$ of the inspection windows 180 so that the maximum protrusions 192 can be detected through the inspection windows 180. In this manner, the registry of the IC module can be accurately controlled. The side walls 140 and 148 also include a beveled upper edge 194 and 196 respectively to facilitate entry of the IC module 50 (FIG. 1) into the socket connector 20. The IC module 50 will naturally align itself to the maximum protrusions 192 on the datum protrusions 182.

Figure 4:
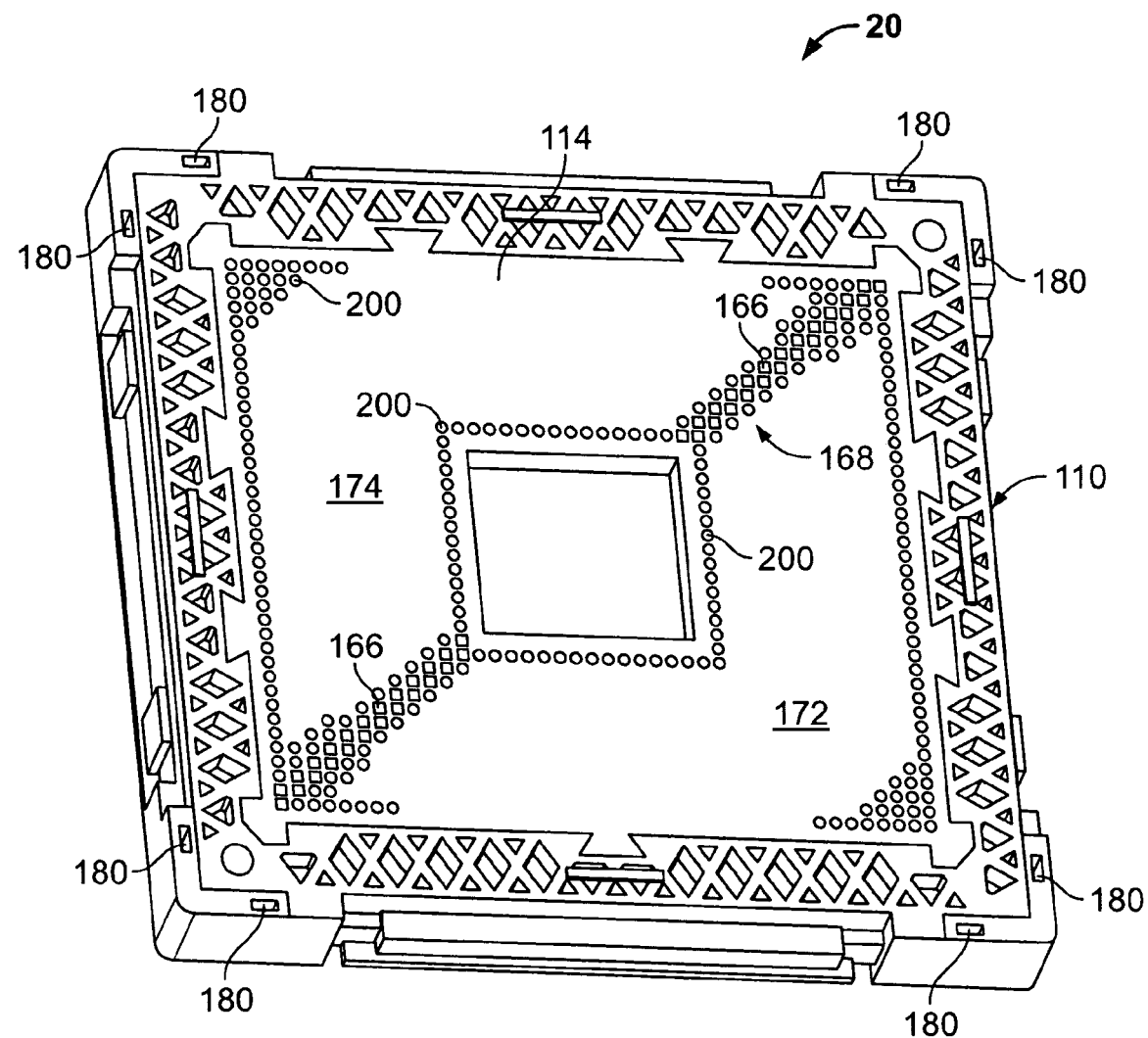
FIG. 4 is a perspective view of the underside of the socket connector shown in FIG. 2.

FIG. 4 is a perspective view of the bottom side 114 of the socket connector 20. As shown in FIG. 4, the apertures or inspection windows 180 extend completely through the base 110. Each of the contacts 164 (FIG. 3) loaded into the base 110 includes a solder ball 200 that is used to mount the socket connector 20 to the circuit board 24 (FIG. 1). The inspection windows 180 extend through the base 110 so that the datum protrusions 182 (FIG. 3) can be viewed from the underside 114 of the socket connector 20 to register the position of the solder balls 200 to enable precise placement of the socket connector 20 on the circuit board 24. FIG. 4 also more clearly shows the unused contact cavities 166 that form the diagonal 168 that separates the contact arrays 172 and 174.

Figure 5:
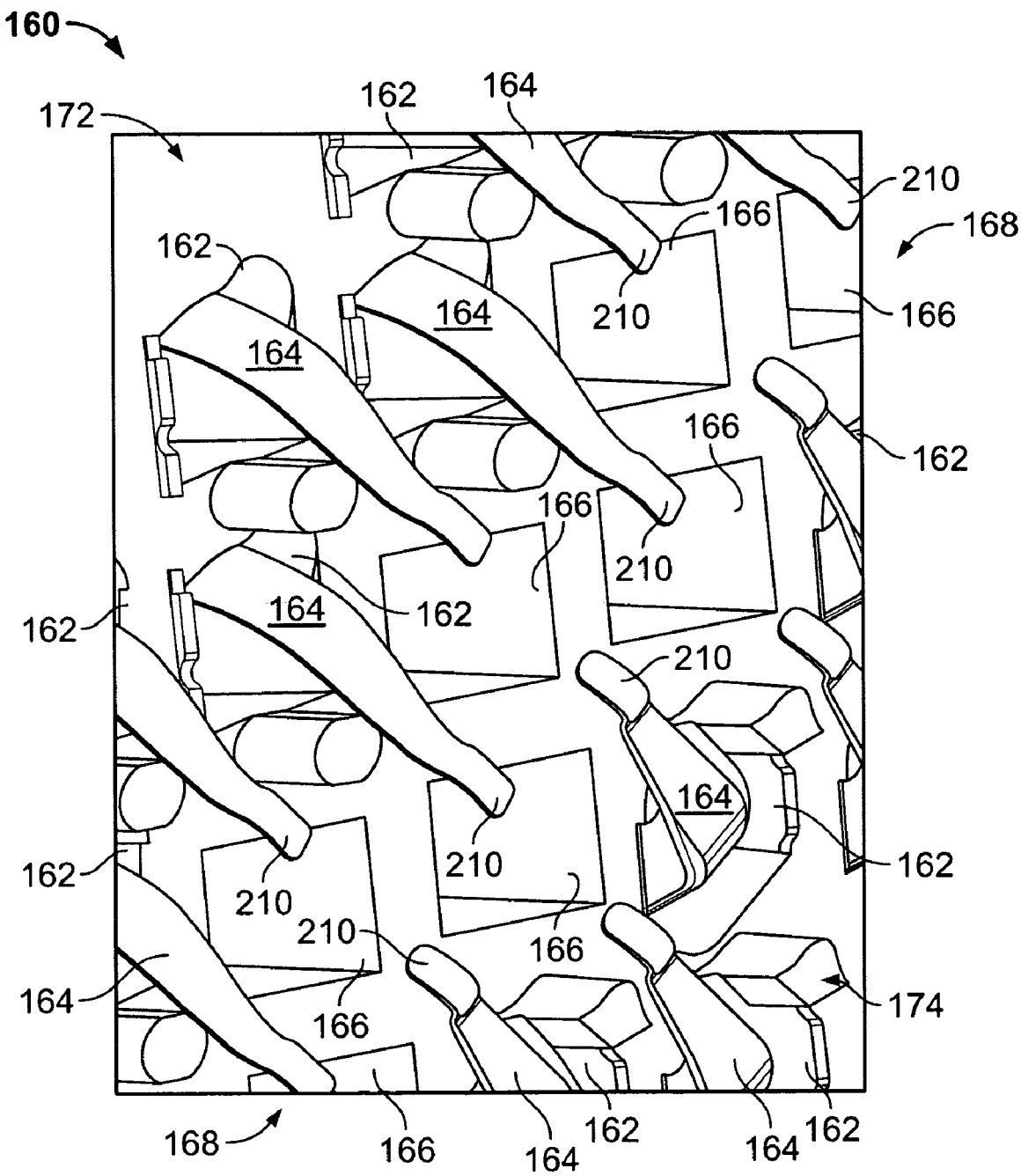
FIG. 5 is an enlarged fragmentary view of a portion of the base of the connector shown in FIG. 2, illustrating opposed contact arrays.

FIG. 5 is a perspective view in detail of a portion of the contact field 160 shown in the phantom section 5 of FIG. 2. The diagonal 168 of unused contact cavities 166 divides the two contact arrays 172 and 174. As shown in FIG. 5, the contacts 164 are oriented such that the contact tips 210 of the contacts 164 in each contact array 172, 174 are facing one another. The contacts 164 in an LGA socket connector, such as the socket connector 20 (FIG. 2), are subjected to a mating load when the IC module 50 (FIG. 1), including the electronic package 54, (FIG. 1) is loaded into the socket connector housing 40 (FIG. 2) and when the electronic assembly 10 (FIG. 1) is fully assembled. The mating load deflects the contacts 164 to assure that electrical connectivity is established between each of the contacts 164 and the electronic package 54.

As the number of contacts 164 in the socket connector housing 40 (FIG. 2) increases, the total mating load resulting from the force on the contacts 164 also increases. When all of the contacts 164 in the socket connector housing 40 are oriented in the same direction, the electronic package 54 has a tendency to "ride" with the tips 210 of the contacts 164 as the contacts 164 deflect and shift toward one side edge 120, 122, 124, 126, or one of the raised corners 42 of the socket connector housing 40. The mating forces, particularly when sustained over long periods of time and together with the heat to which the socket connector 20 and other components are subjected can weaken the socket connector housing 40. Over time, the socket connector housing 40 can weaken sufficiently to allow the electronic package 54 to shift relative to the circuit board 24 and upset electrical continuity between the electronic package 54 and the circuit board 24. When the contact field 160 is divided such that there are two opposing contact arrays such as the arrays 172 and 174, the mating forces resulting from the mating load on the contacts 164 are divided between the two contact arrays 172, 174 with the forces in each array 172, 174 directed toward the other substantially canceling each other so that the electronic package 54 moves vertically downward into the socket connector housing 40 without shifting and remains positionally stable over time.

Returning to FIGS. 1 and 2, the socket connector 20 is positioned on the circuit board 24 so that electrical continuity is properly established between the circuit board 24 and the electronic package 54 which requires that the socket connector 20 be accurately positioned on the circuit board 24. When loaded onto the socket connector 20, the electronic package 54 naturally aligns on the maximum protrusions 192 (FIG. 3) on the side walls 140, 142, 144, 146, 148, 150, 152, 154 of the socket connector housing 40. The datum protrusions 182 are formed with protruding center sections 190 (FIG. 3) that include the maximum protrusions 192 on the side walls 140, 142, 144, 146, 148, 150, 152, 154. Further, the protruding center sections 190 are positioned such that the maximum protrusions 192 on the datum protrusions 182 lie within the inspection windows 180. Using the inspection windows 180, the socket connector housing 40 can be backlit so that the first datum dimension $D_1$ in the direction of the arrow B can be measured between a pair of datum protrusions 182 and a second datum dimension $D_2$ in the direction of the arrow A can be measured between another pair of datum protrusions 182. The dimensions $D_1$ and $D_2$ are taken at the maximum protrusions 192 on the protruding center sections 190 of each datum protrusion 182. By dividing the datum dimensions $D_1$ and $D_2$ in half, a coordinate location is determined that represents a geometric center $G_C$ of the socket connector housing 40. The inspection windows 180 extend through the base 110 of the socket connector housing 40 so that the datum protrusions 182 can be sighted from the bottom side 114 of the base 110 and the position of each contact solder ball 200 relative to the datum protrusions can be visually inspected. The inspection windows 180 also enhance the inspection of the contact tips 210 from the top side 112 of the base 110. The positions of both the solder ball 200 and contact tip 210 can be located relative to the previously determined geometric center $G_C$. Thus, the inspection windows 180 enhance the inspection of the datum protrusions 182 from both the top side 112 and bottom side 114 of the base 110 of the socket connector housing 40. The datum protrusions 182 provide a common reference for both the contact solder balls 200 and the contact tips 210. Also, the IC module 50 self aligns on the maximum protrusions 192 on the datum protrusions 182 such that the positioning of the electronic package 54 is controlled to the same common reference.

In alternative embodiments wherein a divided contact field 160 is not employed, the inspection process or inspection procedure changes slightly. In such embodiments, it must first be determined to which side wall 140, 142, 144, 146, 148, 150, 152, 154, or raised corner 42 of the socket connector housing 40 the electronic package 54 will shift when placed under the mating load. The inspection windows 180 can then be used to determine datum dimensions that locate the contact solder balls 200 and contact tips 210 relative to the particular side 120, 122, 124, 126 or particular raised corner 42 to which the electronic package 54 shifts under load.

The embodiments thus described provide a socket connector 200 having inspection windows 180 that allow datum protrusions 182 on the socket connector housing 40 to be viewed and inspected from both a top side 112 and a bottom side 114 of the connector housing 40. The datum protrusions 182 are formed on the socket connector side walls 140, 142, 144, 146, 148, 150, 152, 154 and the datum protrusions are formed with protruding center sections 190 that include the maximum protrusions 192 on the side walls 140, 142, 144, 146, 148, 150, 152, 154 and with the maximum protrusions 192 positioned within the inspection windows 180. The inspection windows 180 allow for the measurement of datum dimensions $D_1$ and $D_2$ that can be used to determine a geometrical center $G_C$ from which locations of each contact solder ball 200 and each contact tip 210 can be verified. The same datum protrusions 182 also control the registry of the electronic package 54 within the socket connector housing 40. In an exemplary embodiment, the contact field 160 in the socket connector housing 40 includes opposed contact arrays 172 and 174 that cooperate to minimize shifting of the electronic package 54 when the package is under a mating load.

While the invention has been described in terms of various specific embodiments, those skilled in the art will recognize that the invention can be practiced with modification within the spirit and scope of the claims.

What is claimed is:

1. A socket connector comprising:
   a housing holding a plurality of electrical contacts, said housing including a base having a top side and a bottom side, and opposed side walls upwardly extending from said top side of said base;
   a datum protrusion formed on each of said side walls, said datum protrusions defining a first dimension extending in a first direction and a second dimension extending in a second direction that is perpendicular to said first direction, said first and second dimensions extending from a maximum protrusion on one of said side walls to a maximum protrusion on an opposed side wall; and
   an inspection window proximate each said datum protrusion, said inspection windows enabling a measurement of said first dimension and said second dimension.

2. The socket connector of claim 1, wherein said first and second dimensions define a geometric center relative to a raised corner formed by said side walls of said housing.

3. The socket connector of claim 1, wherein said first and second dimensions define a geometric center relative to a raised corner formed by said side walls of said housing, said geometric center having coordinates comprising a mid point of each said first and second dimensions.

4. The socket connector of claim 1, wherein each of said geometric center comprises a reference point for locating each of said plurality of contacts relative to a raised corner formed by said side walls of said housing.

5. The socket connector of claim 1, wherein said datum protrusions register an integrated circuit (IC) module when the IC module is loaded into the socket.

6. The socket connector of claim 1, wherein said datum protrusions and said inspection windows are located proximate raised corners formed by said side walls of said housing.

7. The socket connector of claim 1, wherein said plurality of contacts comprise a first contact array and a second contact array, and wherein said contacts in said first contact array are oriented toward said contacts in said second contact array.

8. The socket connector of claim 1, wherein said base includes cavities not holding contacts arranged along a diagonal through said base and said plurality of contacts comprise a first contact array on a first side of said diagonal and a second contact array on a second side of said diagonal.

9. The socket connector of claim 1, wherein said socket connector is a land grid array (LGA) socket connector.

10. The socket connector of claim 1, wherein each said inspection window includes a width and each said datum protrusion includes said maximum protrusion on a respective side wall that is located within said width of said inspection window.

11. A socket connector comprising:
    a housing holding a plurality of electrical contacts, said housing including a base having a top side and a bottom side, and opposed side walls upwardly extending from said top side of said base;
    a datum protrusion formed on each of said side walls, said datum protrusion including a maximum protrusion on said side wall; and
    an aperture extending through said base proximate each said datum protrusion; and located such that said maximum protrusion on said datum protrusion can be detected from said upper side and said lower side of said base.

12. The socket connector of claim 11, wherein said datum protrusions register an integrated circuit (IC) module when the IC module is loaded into the socket.

13. The socket connector of claim 11, wherein said datum protrusions and said apertures are located proximate raised corners formed by said side walls.

14. The socket connector of claim 11, wherein said datum protrusions define a first dimension extending in a first direction and a second dimension extending in a second direction perpendicular to said first direction, said first and second dimensions determining a reference point that locates each contact in said housing.

15. The socket connector of claim 11, wherein said datum protrusions define a first dimension extending in a first direction and a second dimension extending in a second direction perpendicular to said first direction, and wherein said first and second dimensions define a geometric center relative to a raised corner formed by said side walls of said housing.

16. The socket connector of claim 11, wherein said datum protrusions define a first dimension extending in a first direction and a second dimension extending in a second direction perpendicular to said first direction, and wherein said first and second dimensions define a geometric center relative to a raised corner formed by said side walls of said housing, said geometric center having coordinates comprising a mid point of each said first and second dimensions.

17. The socket connector of claim 11, wherein said plurality of contacts comprise a first contact array and a second contact array, and wherein said contacts in said first contact array are oriented toward said contacts in said second contact array.

18. The socket connector of claim 11, wherein said base includes cavities not holding contacts arranged along a diagonal through said base and said plurality of contacts comprise a first contact array on a first side of said diagonal and a second contact array on a second side of said diagonal.

19. The socket connector of claim 11, wherein said socket connector is a land grid array (LGA) socket connector.

20. The socket connector of claim 11, wherein said aperture includes a width and said maximum protrusion on said datum protrusion is located within said width of said aperture.

* * * * *